(12) United States Patent
Pelham et al.

(10) Patent No.: US 7,098,512 B1
(45) Date of Patent: *Aug. 29, 2006

(54) LAYOUT PATTERNS FOR DEEP WELL REGION TO FACILITATE ROUTING BODY-BIAS VOLTAGE

(75) Inventors: Mike Pelham, Sunnyvale, CA (US); James B. Burr, Foster City, CA (US)

(73) Assignee: Transmeta Corporation, Santa Clara, CA (US)

( * ) Notice: Subject to any disclaimer, the term of this patent is extended or adjusted under 35 U.S.C. 154(b) by 73 days.

This patent is subject to a terminal disclaimer.

(21) Appl. No.: 10/683,732

(22) Filed: Oct. 10, 2003

Related U.S. Application Data

(63) Continuation-in-part of application No. 10/334,272, filed on Dec. 31, 2002, now Pat. No. 6,936,898.

(51) Int. Cl.
*H01L 29/76* (2006.01)

(52) U.S. Cl. .............. 257/371; 257/369; 257/372; 257/373; 257/210; 257/206; 257/403; 257/374; 257/355; 257/299; 257/544; 257/216; 257/349; 257/536; 257/401; 257/296

(58) Field of Classification Search ........... 257/371, 257/369, 372, 210, 206, 401, 373, 403, 374, 257/296, 355, 299, 544, 216, 349, 536; 438/284, 438/286

See application file for complete search history.

(56) References Cited

U.S. PATENT DOCUMENTS

| | | | |
|---|---|---|---|
| 5,447,876 A | 9/1995 | Moyer et al. | 437/41 |
| 6,048,746 A | 4/2000 | Burr | 438/17 |
| 6,087,892 A | 7/2000 | Burr | 327/534 |
| 6,091,283 A | 7/2000 | Murgula et al. | 327/537 |
| 6,169,310 B1 * | 1/2001 | Kalnitsky et al. | 257/355 |
| 6,218,708 B1 | 4/2001 | Burr | 257/372 |
| 6,303,444 B1 | 10/2001 | Burr | 438/289 |
| 6,489,224 B1 | 12/2002 | Burr | 438/526 |
| 6,936,898 B1 | 8/2005 | Pelham et al. | 257/371 |
| 2001/0028577 A1 | 10/2001 | Sung et al. | 365/185.18 |

FOREIGN PATENT DOCUMENTS

EP 0624909 A2 11/1994

* cited by examiner

*Primary Examiner*—Eddie Lee
*Assistant Examiner*—Junghwa Im

(57) ABSTRACT

Layout patterns for the deep well region to facilitate routing the body-bias voltage in a semiconductor device are provided and described. The layout patterns include a diagonal sub-surface mesh structure, an axial sub-surface mesh structure, a diagonal sub-surface strip structure, and an axial sub-surface strip structure. A particular layout pattern is selected for an area of the semiconductor device according to several factors.

56 Claims, 11 Drawing Sheets

LAYOUT PATTERNS FOR DEEP WELL REGION TO FACILITATE ROUTING BODY-BIAS VOLTAGE

CROSS REFERENCE TO RELATED APPLICATION

This patent application is a Continuation-in-Part of, commonly-owned U.S. patent application Ser. No. 10/334,272, filed on Dec. 31, 2002 now U.S. Pat. No. 6,936,898, entitled "Diagonal Deep Well Region for Routing Body-Bias Voltage for MOSFETs in Surface Well Regions", by Pelham et al., which is incorporated herein by reference.

This patent application hereby incorporates by reference US patent application entitled "METHOD AND APPARATUS FOR OPTIMIZING BODY BIAS CONNECTIONS IN CMOS CIRCUITS USING A DEEP N-WELL GRID STRUCTURE," filed on October 10, 2003, Ser. No. 10/683,961, by Burr et al., and assigned to the assignee of the present invention.

BACKGROUND OF THE INVENTION

1. Field of the Invention

The present invention generally relates to MOSFETS (metal oxide semiconductor field effect transistors). More particularly, the present invention relates to the field of routing body-bias voltage to the MOSFETS.

2. Related Art

Generation of the physical layout of a semiconductor device having MOSFETS (metal oxide semiconductor field effect transistors) formed on a semiconductor substrate is a challenging task. An extensive amount of time and resources are spent during the creation of the physical layout. However, consumption of resources can be minimized if new physical layouts utilize substantial potions of existing physical layouts. For example, a new physical layout having MOSFETS that are body-biased would be less expensive to generate if an existing physical layout having MOSFETS without body-bias is utilized and modified according to the needs of the new physical design. Unfortunately, this process of modifying the existing physical layout typically requires forming an additional routing layer for the body-bias voltage on the surface of the semiconductor device, creating a serious issue since the existing physical layout utilizes most, if not all, available surface area.

SUMMARY OF THE INVENTION

Layout patterns for the deep well region to facilitate routing the body-bias voltage in a semiconductor device are provided and described. The layout patterns include a diagonal sub-surface mesh structure, an axial sub-surface mesh structure, a diagonal sub-surface strip structure, and an axial sub-surface strip structure. A particular layout pattern is selected for an area of the semiconductor device according to several factors.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Although the following description of the present invention will focus on routing a body-bias voltage to pFETS (or p-type MOSFETS) formed in surface N-wells via a conductive sub-surface region of N-type doping when a p-type substrate and an N-well process are utilized, the present invention is equally applicable to routing a body-bias voltage to nFETS (or n-type MOSFETS) formed in surface P-wells via a conductive sub-surface region of P-type doping when an n-type substrate and a P-well process are utilized.

Figure 1:
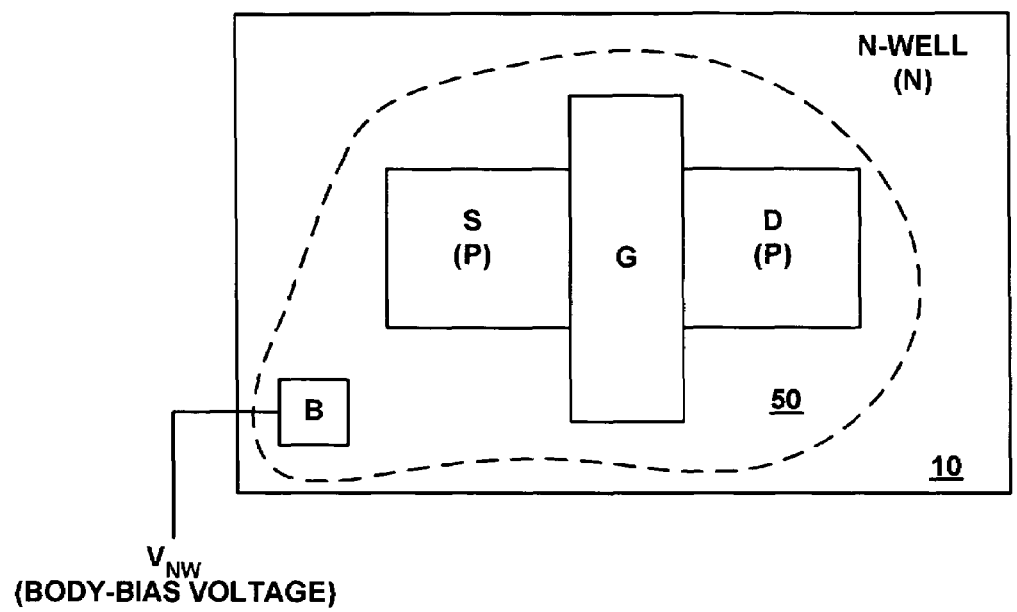
FIG. 1 illustrates a top view of a pFET formed in an N-well in accordance with an embodiment of the present invention, showing the pFET having a body-bias voltage Vnw applied to its bulk/body B terminal.

FIG. 1 illustrates a top view of a pFET 50 (or p-type MOSFET) formed in an N-well 10 when a p-type substrate and an N-well process are utilized in accordance with an embodiment of the present invention, whereas the pFET 50 has a body-bias voltage Vnw applied to its bulk/body B terminal. As depicted in FIG. 1, the pFET 50 has gate G, drain D (p-type doping), source S (p-type doping), and bulk/body B terminals. In particular, the bulk/body B terminal is coupled to the N-well 10. Hence, a voltage applied to the bulk/body B terminal is received by the N-well 10. The N-well has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

The pFET 50 is body-biased to influence its performance. Without body-biasing, the source S and bulk/body B terminals are coupled together. With body-biasing, the source S and bulk/body B terminals are not coupled together. Body-biasing enables controlling the potential difference between the source S and bulk/body B terminals of the pFET 50, providing the ability to electrically tune the threshold voltage level of the pFET 50.

In the case of body-biasing, the bulk/body B terminal receives a body-bias voltage Vnw. As described above, the bulk/body B terminal represents a connection to the N-well 10. Thus, the body-bias voltage Vnw is applied to the N-well 10.

Rather than generating an entire new physical layout for a semiconductor device to support the pFET 50 having the body-bias voltage Vnw, an existing physical layout can be modified. In particular, the existing physical layout is modified by including a deep N-well region to route the body-bias voltage Vnw to the N-wells 10 which generally are separated by P-well regions, whereas the deep N-well represents a conductive sub-surface well layer that is beneath the surface N-well 10. This avoids the need to create another surface routing layer on a surface of the semiconductor device that does not have much free surface area for additional routing.

Several layout patterns for the deep N-well region are described herein. These layout patterns facilitate routing the body-bias voltage in the semiconductor device. The layout patterns include a diagonal sub-surface mesh structure (see FIG. 5A); an axial sub-surface mesh structure (see FIG. 7), a diagonal sub-surface strip structure (see FIG. 6A and FIG. 6B), and an axial sub-surface strip structure (see FIG. 8A and FIG. 8B). A particular layout pattern is selected for an area of the semiconductor device according to several factors as will be described below. Once the particular layout pattern is selected, the layout for the deep N-well region can be generated in an automated manner.

The body-bias voltage Vnw is routed to the N-wells via one or more deep N-well regions (which are conductive sub-surface well layers) as opposed to surface metal layers. In one embodiment, the deep N-well region is a diagonal deep N-well region as will be described below. In another embodiment, the deep N-well region is an axial deep N-well region as will be described below. The advantage of this approach is that while typically there is little or no room on the densely packed surface area of the semiconductor device for extra metal routing layers, the area beneath the surface of the semiconductor device is often underutilized due to the fact that routing signals through wells is generally prohibited by the poor frequency response and potentially unfavorable resistance of the wells. In the present invention, rather than carrying signals, the deep N-well regions serve to hold and distribute the body-bias voltage Vnw.

Further description of the deep N-well regions can be found in the patent application entitled "METHOD AND APPARATUS FOR OPTIMIZING BACK-BIAS CONNECTIONS IN CMOS CIRCUITS USING A DEEP N-WELL GRID STRUCTURE", by James B. Burr and William Schnaitter, which is concurrently filed with the present patent application, which is assigned to the assignee of the present patent application, and which is incorporated by reference herein.

Figure 2A:
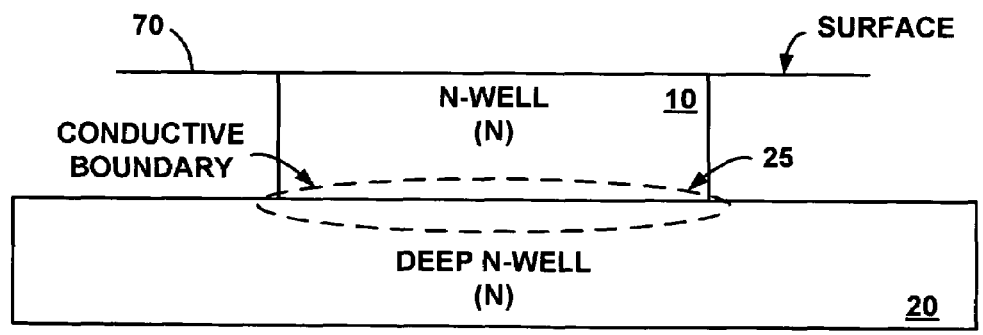
FIG. 2A illustrates the relative positioning of an N-well and a deep N-well region beneath a surface of a semiconductor device in accordance with an embodiment of the present invention.

FIG. 2A illustrates the relative positioning of an N-well 10 (also known as a surface N-well) and a deep N-well region 20 beneath a surface 70 of a semiconductor device in accordance with an embodiment of the present invention. The N-well 10 is formed beneath the surface 70 of the semiconductor device and has an N-type doping. The deep N-well region 20 is formed beneath the N-well 10 such that the deep N-well region 20 and the N-well 10 share a sub-surface conductive boundary 25 that allows the deep N-well region 20 to function like a conductive sub-surface routing layer for routing the body-bias voltage Vnw to the N-wells. That is, the deep N-well region 20 contacts the N-well 10 along the sub-surface conductive boundary 25. Moreover, the deep N-well region 20 is buried under the surface 70 of the semiconductor device. The deep N-well region 20 has an N-type doping. It should be understood that if an n-type substrate and a P-well process were utilized, a deep well of P-type doping would be utilized to function as a conductive sub-surface routing layer for routing the body-bias voltage to the surface P-wells.

The dimensions and size of the sub-surface conductive boundary 25 determine the resistance of the conductive path between the N-well 10 and the deep N-well region 20. As the size of the sub-surface conductive boundary 25 is increased, the resistance of the sub-surface conductive path between the N-well 10 and the deep N-well region 20 is lowered to create a low-resistance conductive path.

Figure 2B:
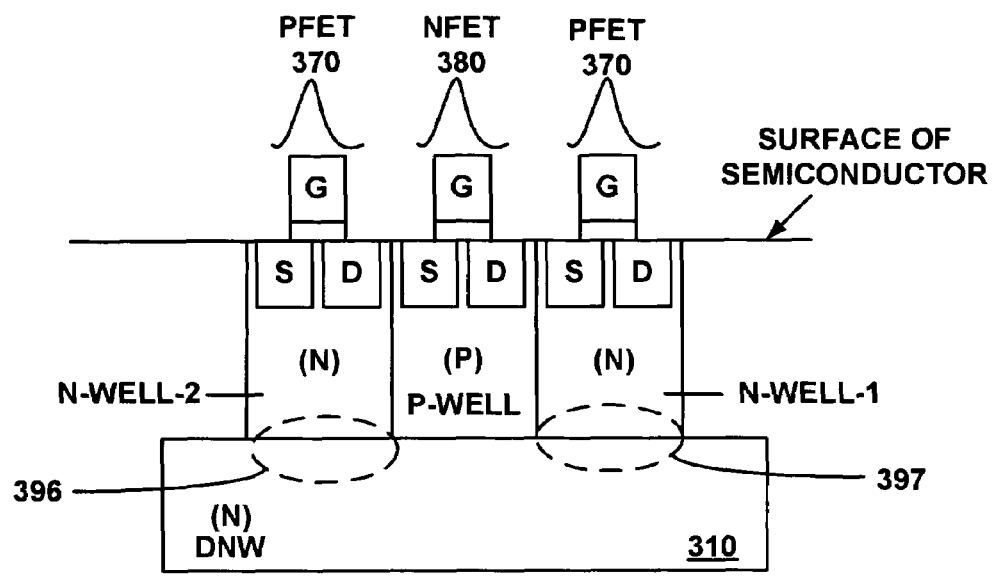
FIG. 2B illustrates a side view of a deep N-well region coupled to the N-well_1 and the N-well_2 in accordance with an embodiment of the present invention, showing the routing of the body-bias voltage.

FIG. 2B illustrates a side view of a deep N-well region coupled to the N-well_1 and the N-well_2 in accordance with an embodiment of the present invention, showing the routing of the body-bias voltage. As illustrated in FIG. 2B, there is a first sub-surface conductive boundary 396 between the N-well_1 and the deep N-well region 310. Moreover, there is a second sub-surface conductive boundary 397 between the N-well_2 and the deep N-well region 310. The surface N-well_1 has a PFET 370. Also, the surface N-well_2 has a PFET 370. The P-well region has an NFET 380 and separates the N-well_1 and the N-well_2. The body-bias voltage Vnw is routed to the N-well_1 and the N-well_2 via the first and second sub-surface conductive boundaries 396 and 397.

Figure 3A:
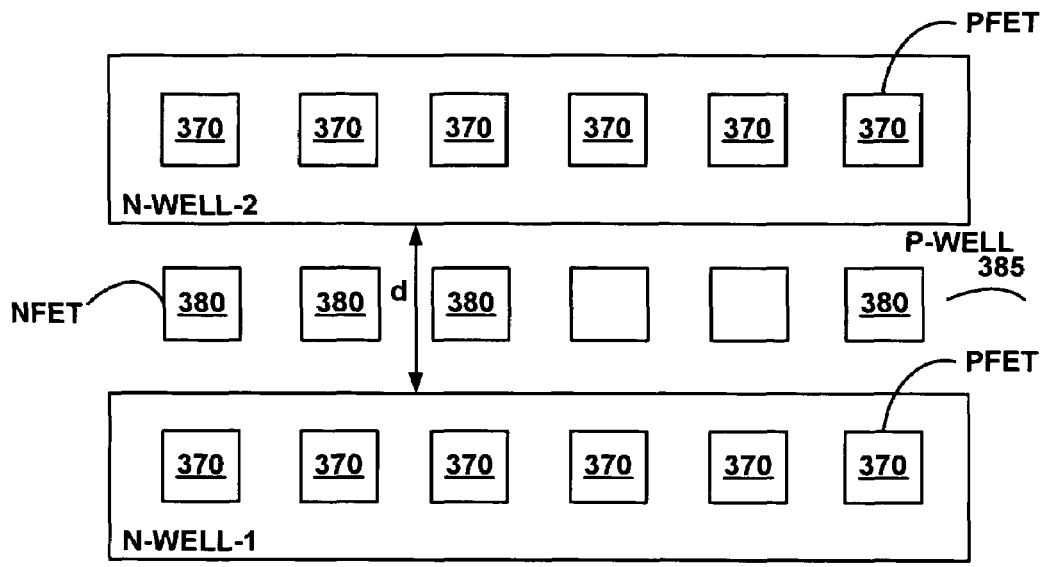
FIG. 3A illustrates a top view of a first arrangement of the N-well_1 and the N-well_2 in accordance with an embodiment of the present invention.

A top view of a first arrangement of the N-well_1 and the N-well_2 in accordance with an embodiment of the present invention is illustrated in FIG. 3A. As depicted in FIG. 3A, the N-well_1 and the N-well_2 have an axial orientation. That is, the N-well_1 and the N-well_2 are positioned along an axis (e.g., x-axis). The N-well_1 and the N-well_2 have an N-type doping. The body-bias voltage Vnw is routed to the N-well_1 and the N-well_2 so that the pFETs 370 can be body-biased via the deep N-well region. Thus, a contact for the body-bias voltage Vnw can be formed wherever there is free surface area, such as above the N-well_1, the N-well_2, or deep N-well region. Since the N-well_1 and the N-well_2 are separated by a P-type region or P-well region 385 on which the nFETS 380 are formed, the layout pattern of the deep N-well is carefully selected to avoid isolating the P-type region or P-well region 385 on which the nFETS 380 are formed, allowing the formation of conductive paths between the P-well region 385 and a sub-surface layer (e.g., doped with P-type material) that is formed beneath the deep N-well region. Here, the N-well_1 and the N-well_2 are separated by the length d.

Figure 3B:
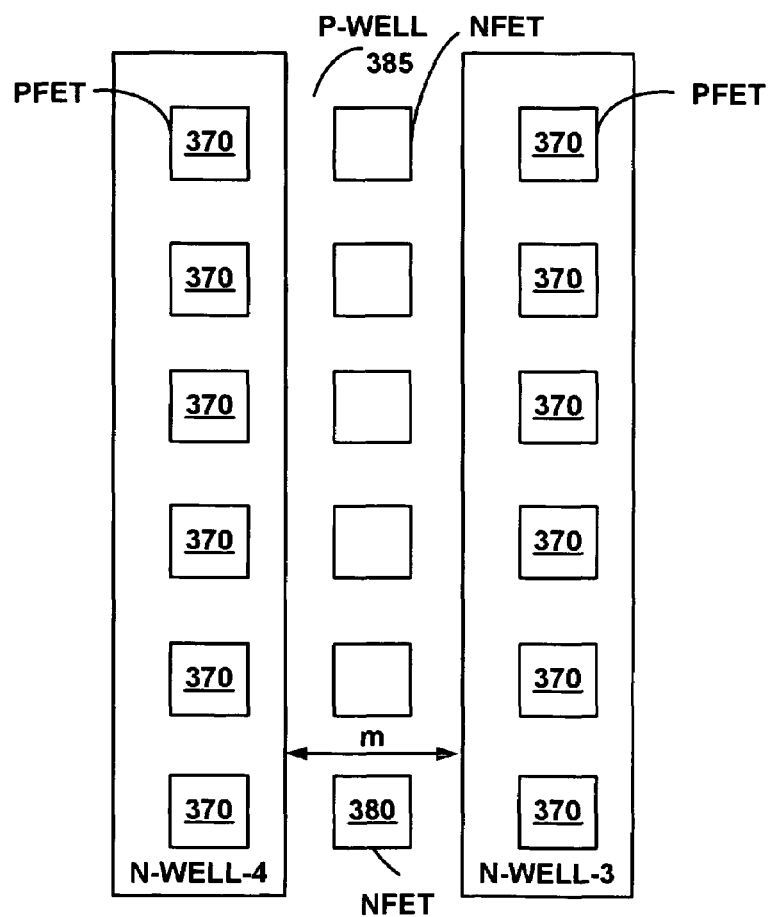
FIG. 3B illustrates a top view of a second arrangement of the N-well_1 and the N-well_2 in accordance with an embodiment of the present invention.

FIG. 3B illustrates a top view of a second arrangement of the N-well_3 and the N-well_4 in accordance with an embodiment of the present invention. As depicted in FIG. 3B, the N-well_3 and the N-well_4 have an axial orientation. That is, the N-well_3 and the N-well_4 are positioned along an axis (e.g., y-axis). The N-well_3 and the N-well_4 have an N-type doping. The body-bias voltage Vnw is routed to the N-well_3 and the N-well_4 so that the pFETs 370 can be body-biased via the deep N-well region. Thus, a contact for the body-bias voltage Vnw can be formed wherever there is free surface area, such as above the N-well_3, the N-well_4, or deep N-well region. Since the N-well_3 and the N-well_4 are separated by a P-type region or P-well region 385 on which the nFETS 380 are formed, the layout pattern of the deep N-well is carefully selected to avoid isolating the P-type region or P-well region 385 on which the nFETS 380 are formed, allowing the formation of conductive paths between the P-well region 385 and a sub-surface layer (e.g., doped with P-type material) that is formed beneath the deep N-well region. Here, the N-well_3 and the N-well_4 are separated by the length m.

Figure 4:
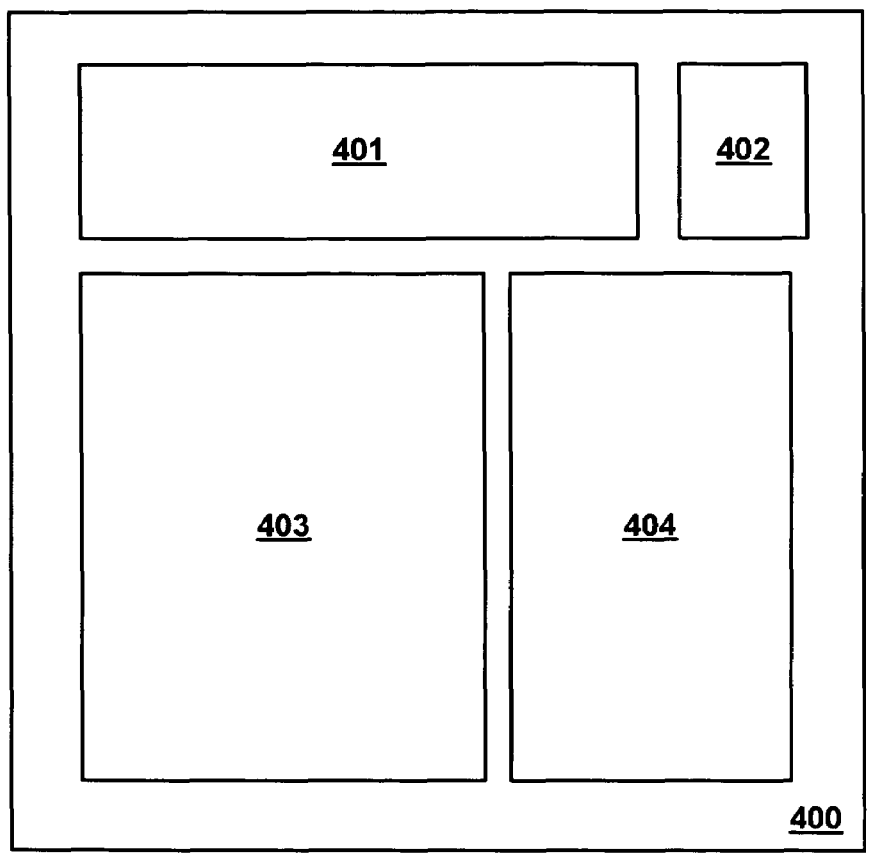
FIG. 4 illustrates a top view of a semiconductor device in accordance with an embodiment of the present invention, showing multiple areas each area corresponding to a separate layout pattern for the deep N-well.

FIG. 4 illustrates a top view of a semiconductor device 400 in accordance with an embodiment of the present invention, showing multiple areas 401–404 each area corresponding to a separate layout pattern for the deep N-well. In general, the layout distribution of surface N-wells and surface P-type regions or P-wells on the semiconductor device 400 is characterized by particular patterns. The semiconductor device 400 can be divided according to these particular patterns into multiple areas 401–404.

Once the layout pattern of the surface N-wells and surface P-type regions or P-wells are recognized, a layout pattern for the deep N-well region can be selected for the particular area. The layout patterns for the deep N-well region include a diagonal sub-surface mesh structure (see FIG. 5A), an axial sub-surface mesh structure (see FIG. 7), a diagonal sub-surface strip structure (see FIG. 6A and FIG. 6B), and an axial sub-surface strip structure (see FIG. 8A and FIG. 8B). The factors evaluated in selecting a particular layout pattern for the deep N-well region include: providing a low resistance conductive path for routing the body-bias voltage and avoiding the isolation of the P-type region or P-well region 385 (FIGS. 3A and 3B) on which the nFETS 380 are formed to allow the formation of conductive paths between the P-well region 385 and a sub-surface layer (e.g., doped with P-type material) that is formed beneath the deep N-well region.

Moreover, the primary factors in determining which particular layout pattern for the deep N-well region to use is the type of layout pattern (e.g., horizontal strips or vertic8al strips) of the surface N-wells (see FIGS. 3A and 3B) and the separation length between adjacent surface N-wells (e.g., separation length d in FIG. 3A, and separation length m in FIG. 3B). Since each type of layout pattern of the surface N-wells (see FIGS. 3A and 3B) exhibits unique characteristics, a layout pattern for the deep N-well region is selected that is appropriate for those characteristics exhibited by the layout pattern of the surface N-wells. Within each area 401–404, adjustments to the layout pattern of the deep N-well can be made to overcome any violations of the layout design rules and to improve the factors described above.

Figure 5A:
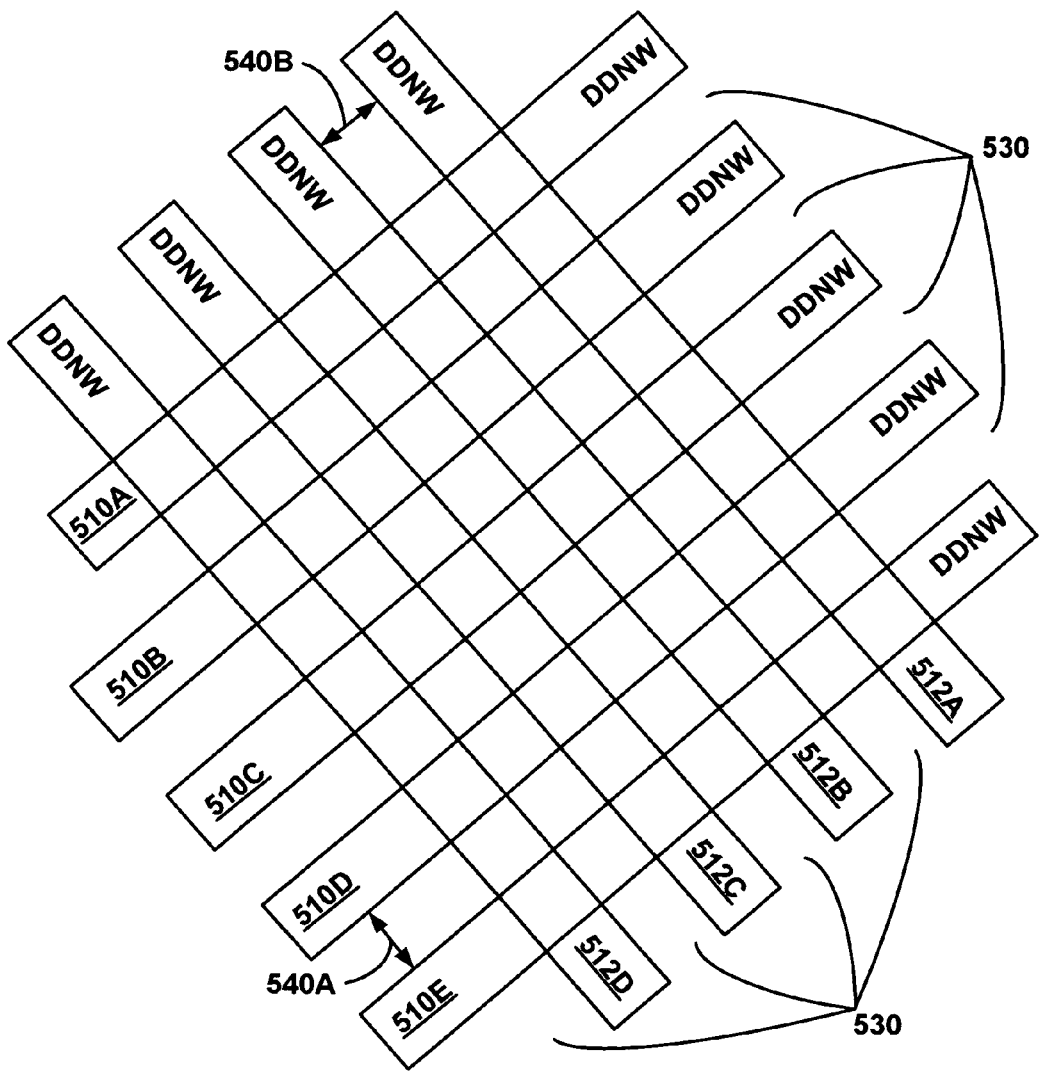
FIG. 5A illustrates a top view of multiple diagonal deep N-well (DDNW) regions forming a diagonal sub-surface mesh structure in accordance with an embodiment of the present invention.

FIG. 5A illustrates a top view of multiple diagonal deep N-well (DDNW) regions forming a diagonal sub-surface mesh structure 500 in accordance with an embodiment of the present invention. Rather than having a continuous planar layer for the deep N-well, multiple diagonal deep N-well (DDNW) regions are patterned according to a layout pattern. As depicted in FIG. 5A, each diagonal deep N-well region 510A–510E and 512A–512D has a strip shape, is formed beneath the surface N-well layer of a semiconductor device, and is doped with an N-type material. The diagonal deep N-well regions 510A–510E are formed in a first parallel orientation while the diagonal deep N-well regions 512A–512D are formed in a second parallel orientation. The first parallel orientation and the second parallel orientation are orthogonal to each other and are diagonal (or slanted) with respect to the N-well regions of FIGS. 3A and 3B. In an embodiment, the first parallel orientation and the N-well regions of FIGS. 3A and 3B form an angle that is approximately 45 degrees. Additionally, in an embodiment, the second parallel orientation and the N-well regions of FIGS. 3A and 3B form an angle that is approximately 45 degrees. Thus, the diagonal deep N-well regions 510A–510E and 512A–512D form a diagonal sub-surface mesh structure 500 for routing the body-bias voltage Vnw to the N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the diagonal sub-surface mesh structure 500 to provide a plurality of sub-surface conductive paths between N-well regions without isolating the P-well region located between the N-wells. That is, the diagonal sub-surface mesh structure 500 contacts the N-wells along the sub-surface conductive boundaries (e.g., sub-surface conductive boundary 25 (FIG. 2A) and sub-surface conductive boundaries 396 and 397 (FIG. 2B).

The orientation of the diagonal sub-surface mesh structure 500 is diagonal with respect to the orientation of the N-well regions of FIGS. 3A and 3B. In an embodiment, the diagonal sub-surface mesh structure 500 is rotated approximately 45 degrees with respect to the N-well regions of FIGS. 3A and 3B. It should be understood that the diagonal sub-surface mesh structure 500 can have other configurations. For example, the gaps 540A and 540B between adjacent diagonal deep N-well regions can vary in size. Moreover, the ratio of diagonal deep N-well regions to gap area 430 can vary.

Additionally, the diagonal sub-surface mesh structure 500 enables the nFETS (n-type MOSFETS) 380 (FIGS. 3A and 3B) to be body-biased in any manner by preventing isolation of a P-type region or P-well region 385 (FIGS. 3A and 3B) on which the nFETS 380 are formed. The gap area 530 between diagonal deep N-well regions 510A–510E and 512A–512D prevent isolation of the P-well region 385 and enable a conductive path between the P-well region 385 and a sub-surface layer that is beneath the diagonal deep N-well regions 510A–510E and 512A–512D. In an embodiment, the area of the diagonal sub-surface mesh structure 500 is equally divided between diagonal deep N-well regions (e.g., 510A–510E and 512A–512D) and gap area 530.

As discussed above, a contact for the body-bias voltage Vnw can be formed wherever there is free space, such as above the N-well regions or above the diagonal deep N-well regions 510A–510E and 512A–512D. Moreover, the location and size of the diagonal sub-surface mesh structure 500 is based on the distribution of the N-wells and the P-type regions or P-wells, whereas the goal is to provide low resistance conductive paths for the body-bias voltage Vnw.

However, the size of the diagonal sub-surface mesh structure 500 should avoid isolating the P-type regions or P-wells 385 (FIGS. 3A and 3B) from sub-surface layers that are formed beneath the diagonal deep N-well regions 510A–510E and 512A–512D. Moreover, the gap area 530 is sized so that to provide a low-resistance conductive path between the P-type regions or P-wells 385 and a sub-surface layer that is formed beneath the diagonal deep N-well regions, whereas the greater the gap area 530 the lower the resistance of this conductive path. Additionally, lateral diffusion and lateral depletion can further reduce the gap area 530, potentially pinching-off this conductive path between the P-type regions or P-wells 385 and a sub-surface layer that is formed beneath the diagonal deep N-well regions. As a solution to this situation, the gaps 540A and 540B between adjacent diagonal deep N-well regions are made sufficiently wide to avoid pinching-off this conductive path between the P-type regions or P-wells 385 and a sub-surface layer that is formed beneath the diagonal deep N-well regions. Yet, as the number and size of the diagonal deep N-well regions are increased, the resistance of the conductive path for routing the body-bias voltage Vnw is decreased because there are larger and more sub-surface conductive boundaries between the N-well regions and the diagonal deep N-well regions. Hence, there is a trade-off between the gap area 530 and the diagonal deep N-well regions in each design situation.

Figure 5B:
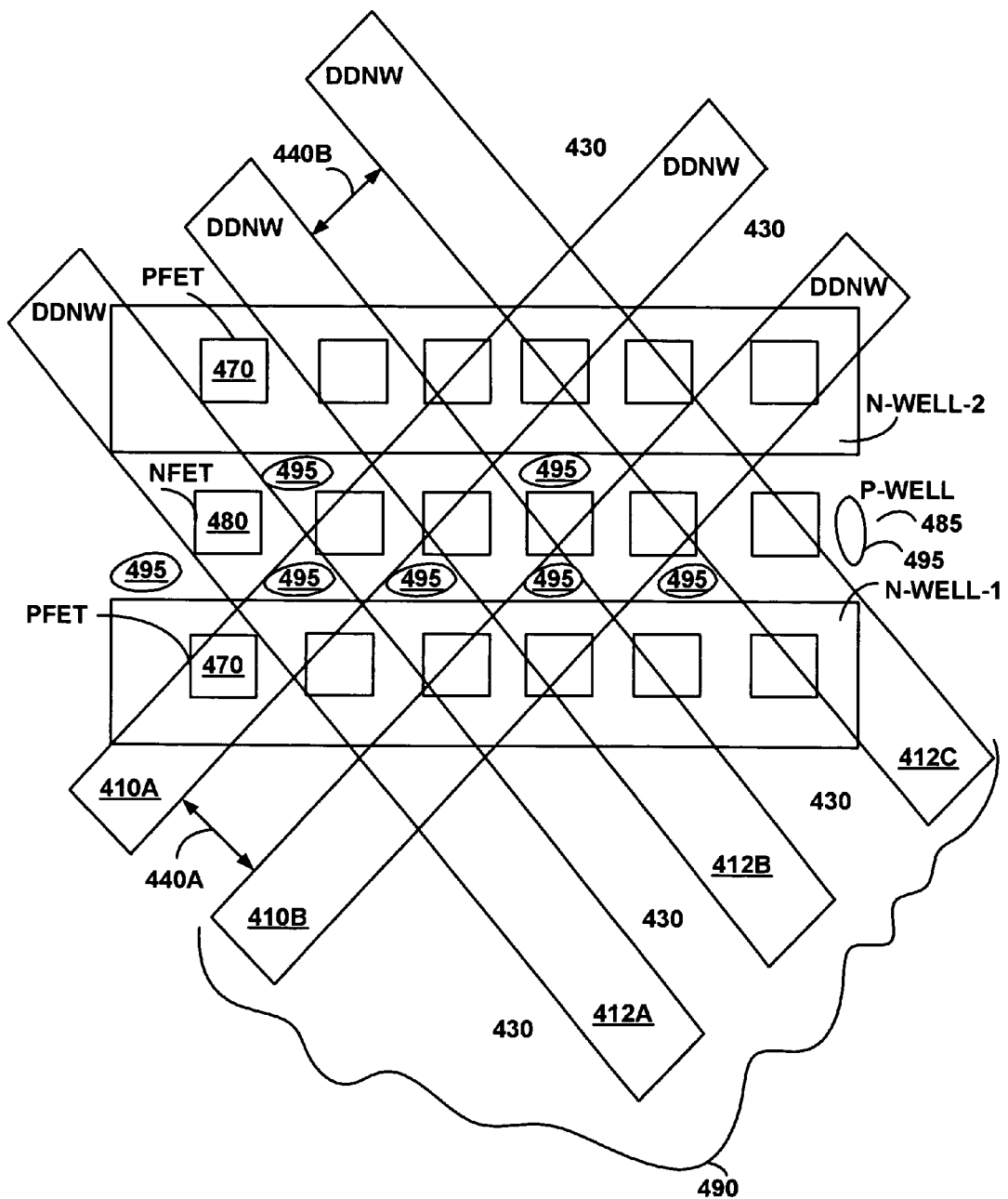
FIG. 5B illustrates a top view of multiple N-wells and multiple diagonal deep N-well (DDNW) regions forming a diagonal sub-surface mesh structure in accordance with an embodiment of the present invention.

FIG. 5B illustrates a top view of multiple N-wells (e.g., N-well_1 and the N-well_2) and multiple diagonal deep N-well (DDNW) regions forming a diagonal sub-surface mesh structure in accordance with an embodiment of the present invention. Here, the diagonal deep N-well regions 410A and 410B are orthogonal to the diagonal deep N-well regions 412A, 412B, and 412C. Thus, the diagonal deep N-well regions 412A, 412B, 412C, 410A, and 410B form a diagonal sub-surface mesh structure 490 for routing the body-bias voltage Vnw to the N-well_1 and the N-well_2 so that the pFETs 470 can be body-biased. In an embodiment, the area of the diagonal sub-surface mesh structure 490 is equally divided between diagonal deep N-well regions and gap area 430.

It should be understood that the diagonal sub-surface mesh structure 490 can have other configurations. The gaps 440A and 440B between adjacent diagonal deep N-well regions can vary in size. Moreover, the ratio of diagonal deep N-well regions to gap area 430 can vary. The regions 495 between diagonal deep N-well regions prevent isolation of the P-well region 485 and enable a conductive path between the P-well region 485 and a sub-surface layer that is beneath the diagonal deep N-well regions 412A, 412B, 412C, 410A, and 410B.

Figure 6A:
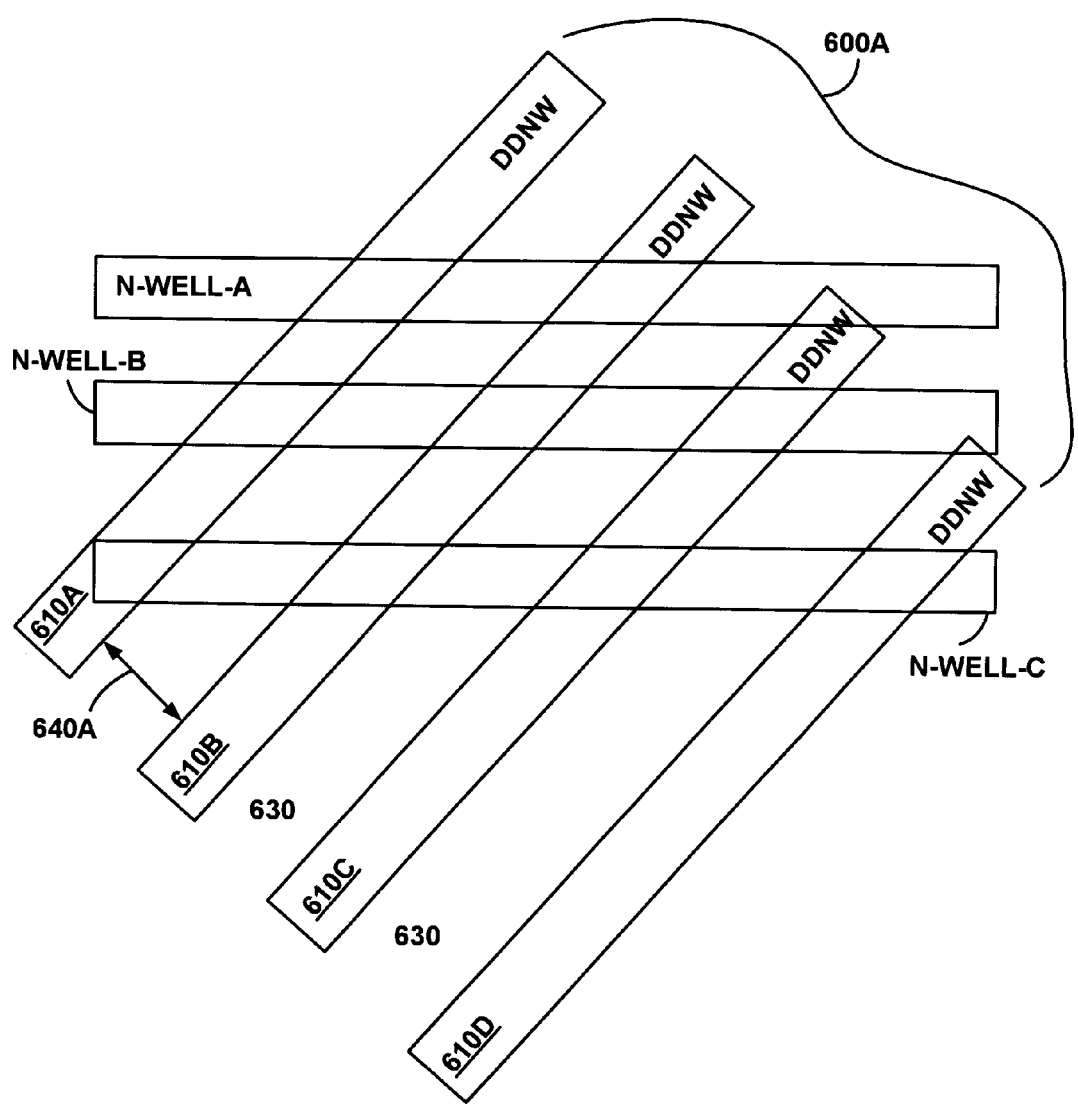
FIG. 6A illustrates a top view of multiple diagonal deep N-well (DDNW) regions forming a first diagonal sub-surface strip structure in accordance with an embodiment of the present invention.

A top view of multiple diagonal deep N-well (DDNW) regions forming a first diagonal sub-surface strip structure 600A in accordance with an embodiment of the present invention is illustrated in FIG. 6A. In this layout pattern, each diagonal deep N-well region 610A–610D has a strip shape, is formed beneath the surface N-well layer of a semiconductor device, and is doped with an N-type material.

The diagonal deep N-well regions 610A–610D are formed in a first parallel orientation. The first parallel orientation is diagonal (or slanted) with respect to the surface N-well regions (e.g., N-well_A, N-well_B, and N-well_C). In an embodiment, the first parallel orientation and the N-well regions form an angle that is approximately 45 degrees. In this case, the combination of the surface N-well regions (e.g., N-well_A, N-well_B, and N-well_C) and the first diagonal sub-surface strip structure 600A forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the first diagonal sub-surface strip structure 600A to provide a plurality of sub-surface conductive paths between N-well regions without isolating the P-well region located between the N-wells. That is, the first diagonal sub-surface strip structure 600A contacts the N-wells along the sub-surface conductive boundaries (e.g., sub-surface conductive boundary 25 (FIG. 2A) and sub-surface conductive boundaries 396 and 397 (FIG. 2B).

As described above, the combination of the surface N-well regions (e.g., N-well_A, N-well_B, and N-well_C) and diagonal deep N-well regions 610A–610D, which form the first diagonal sub-surface strip structure 600A, facilitate the routing of the body-bias voltage Vnw to the N-well regions so that the pFETs can be body-biased. The first diagonal sub-surface strip structure 600A can be utilized in areas of the semiconductor device that have a dense layout such as areas corresponding to a SRAM (static random access memory). It should be understood that the first diagonal sub-surface strip structure 600A can have other configurations. The gap 640A between adjacent diagonal deep N-Well regions can vary in size. Moreover, the ratio of diagonal deep N-well regions to gap area 630 can vary.

Figure 6B:
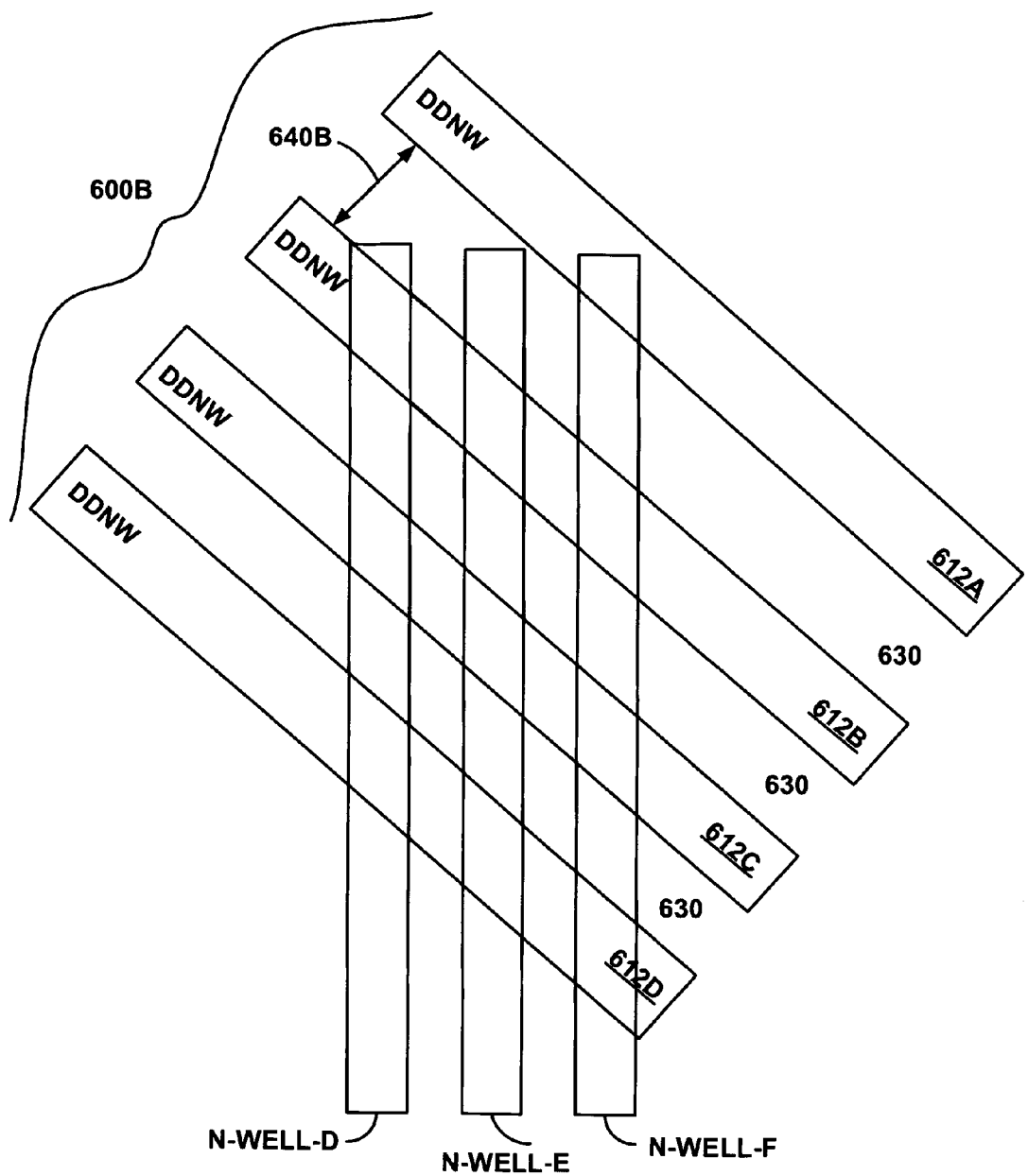
FIG. 6B illustrates a top view of multiple diagonal deep N-well (DDNW) regions forming a second diagonal sub-surface strip structure in accordance with an embodiment of the present invention.

FIG. 6B illustrates a top view of multiple diagonal deep N-well (DDNW) regions forming a second diagonal sub-surface strip structure 600B in accordance with an embodiment of the present invention. In this layout pattern, each diagonal deep N-well region 612A–612D has a strip shape, is formed beneath the surface N-well layer of a semiconductor device, and is doped with an N-type material. The diagonal deep N-well regions 612A–612D are formed in a second parallel orientation. The second parallel orientation is diagonal (or slanted) with respect to the surface N-well regions (e.g., N-well_D, N-well_E, and N-well_F). In an embodiment, the second parallel orientation and the N-well regions form an angle that is approximately 45 degrees. In this case, the combination of the surface N-well regions (e.g., N-well_D, N-well_E, and N-well_F) and the second diagonal sub-surface strip structure 600B forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the second diagonal sub-surface strip structure 600B to provide a plurality of sub-surface conductive paths between N-well regions without isolating the P-well region located between the N-wells. That is, the second diagonal sub-surface strip structure 600B contacts the N-wells along the sub-surface conductive boundaries (e.g., sub-surface conductive boundary 25 (FIG. 2A) and sub-surface conductive boundaries 396 and 397 (FIG. 2B).

As described above, the combination of the surface N-well regions (e.g., N-well_D, N-well_E, and N-well_F) and diagonal deep N-well regions 612A–612D, which form the second diagonal sub-surface strip structure 600B, facilitate routing of the body-bias voltage Vnw to the N-well regions so that the pFETs can be body-biased. The second diagonal sub-surface strip structure 600B can be utilized in areas of the semiconductor device that have a dense layout such as areas corresponding to a SRAM (static random access memory). It should be understood that the second diagonal sub-surface strip structure 600B can have other configurations. The gap 640B between adjacent diagonal deep N-well regions can vary in size. Moreover, the ratio of diagonal deep N-well regions to gap area 630 can vary.

Figure 7:
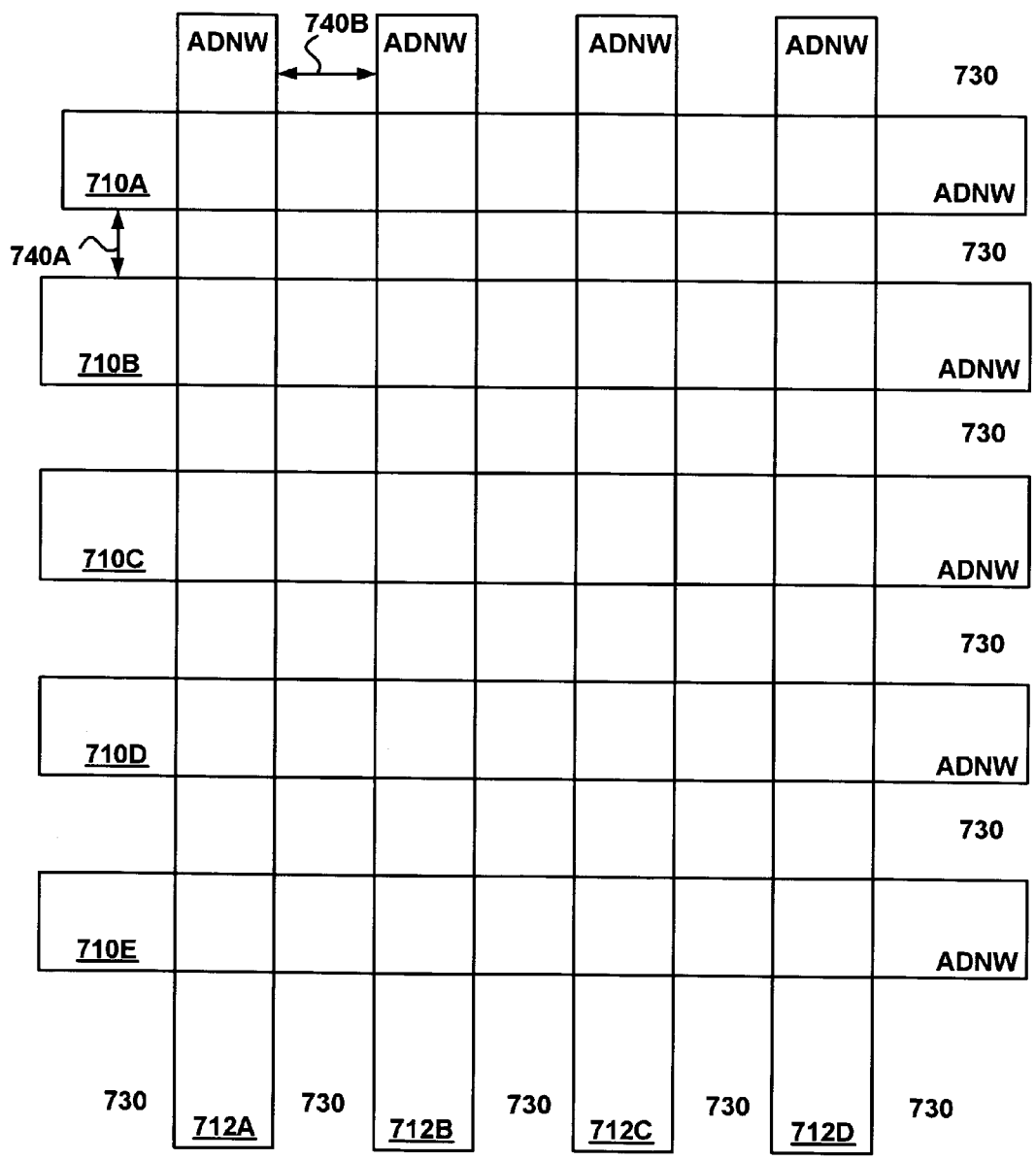
FIG. 7 illustrates a top view of multiple axial deep N-well (ADNW) regions forming an axial sub-surface mesh structure in accordance with an embodiment of the present invention.

FIG. 7 illustrates a top view of multiple axial deep N-well (ADNW) regions forming an axial sub-surface mesh structure 700 in accordance with an embodiment of the present invention. As depicted in FIG. 7, each axial deep N-well region 710A–710E and 712A–712D has a strip shape, is formed beneath the surface N-well layer of a semiconductor device, and is doped with an N-type material. The axial deep N-well regions 710A–710E are formed in a first parallel orientation while the diagonal deep N-well regions 712A–712D are formed in a second parallel orientation. The first parallel orientation and the second parallel orientation are orthogonal to each other and are axially positioned with respect to the N-well regions of FIGS. 3A and 3B. That is, the first parallel orientation and the second parallel orientation are oriented along an axis (e.g., y-axis or x-axis) in the same manner as the N-well regions of FIGS. 3A and 3B. In an embodiment, the first parallel orientation is parallel to the N-well regions of FIG. 3A and is perpendicular to the N-well regions of FIG. 3B. Additionally, in an embodiment, the second parallel orientation is parallel to the N-well regions of FIG. 3B and is perpendicular to the N-well regions of FIG. 3A. Thus, the axial deep N-well regions 710A–710E and 712A–712D form an axial sub-surface mesh structure 700 for routing the body-bias voltage Vnw to the N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the axial sub-surface mesh structure 700 to provide a plurality of sub-surface conductive paths between N-well regions without isolating the P-well region located between the N-wells. That is, the axial sub-surface mesh structure 700 contacts the N-wells along the sub-surface conductive boundaries (e.g., sub-surface conductive boundary 25 (FIG. 2A) and sub-surface conductive boundaries 396 and 397 (FIG. 2B).

It should be understood that the axial sub-surface mesh structure 700 can have other configurations. For example, the gaps 740A and 740B between adjacent axial deep N-well regions can vary in size. Moreover, the ratio of axial deep N-well regions to gap area 730 can vary.

Additionally, the axial sub-surface mesh structure 700 enables the nFETS (n-type MOSFETS) 380 (FIGS. 3A and 3B) to be body-biased in any manner by preventing isolation of a P-type region or P-well region 385 (FIGS. 3A and 3B) on which the nFETS 380 are formed. The gap area 730 between axial deep N-well regions 710A–710E and 712A–712D prevent isolation of the P-well region 385 and enable a conductive path between the P-well region 385 and a sub-surface layer that is beneath the axial deep N-well regions 710A–710E and 712A–712D. In an embodiment, the area of the axial sub-surface mesh structure 700 is equally divided between axial deep N-well regions (e.g., 710A–710E and 712A–712D) and gap area 730.

As discussed above, a contact for the body-bias voltage Vnw can be formed wherever there is free space, such as above the N-well regions or above the axial deep N-well regions 710A–710E and 712A–712D. Moreover, the location and size of the axial sub-surface mesh structure 700 is based on the distribution of the N-wells and the P-type regions or P-wells, whereas the goal is to provide low resistance conductive paths for the body-bias voltage Vnw.

As described above, the size of the axial sub-surface mesh structure 700 should avoid isolating the P-type regions or P-wells 385 (FIGS. 3A and 3B) from sub-surface layers that are formed beneath the axial deep N-well regions 710A–710E and 712A–712D. Moreover, the gap area 730 is sized so that to provide a low-resistance conductive path between the P-type regions or P-wells 385 and a sub-surface layer that is formed beneath the axial deep N-well regions, whereas the greater the gap area 730 the lower the resistance of this conductive path. Additionally, lateral diffusion and lateral depletion can further reduce the gap area 730, potentially pinching-off this conductive path between the P-type regions or P-wells 385 and a sub-surface layer that is formed beneath the axial deep N-well regions. As a solution to this situation, the gaps 740A and 740B between adjacent axial deep N-well regions are made sufficiently wide to avoid pinching-off this conductive path between the P-type regions or P-wells 385 and a sub-surface layer that is formed beneath the axial deep N-well regions. Yet, as the number and size of the axial deep N-well regions are increased, the resistance of the conductive path for routing the body-bias voltage Vnw is decreased because there are larger and more sub-surface conductive boundaries between the N-well regions and the axial deep N-well regions. Hence, there is a trade-off between the gap area 730 and the axial deep N-well regions in each design situation.

Figure 8A:
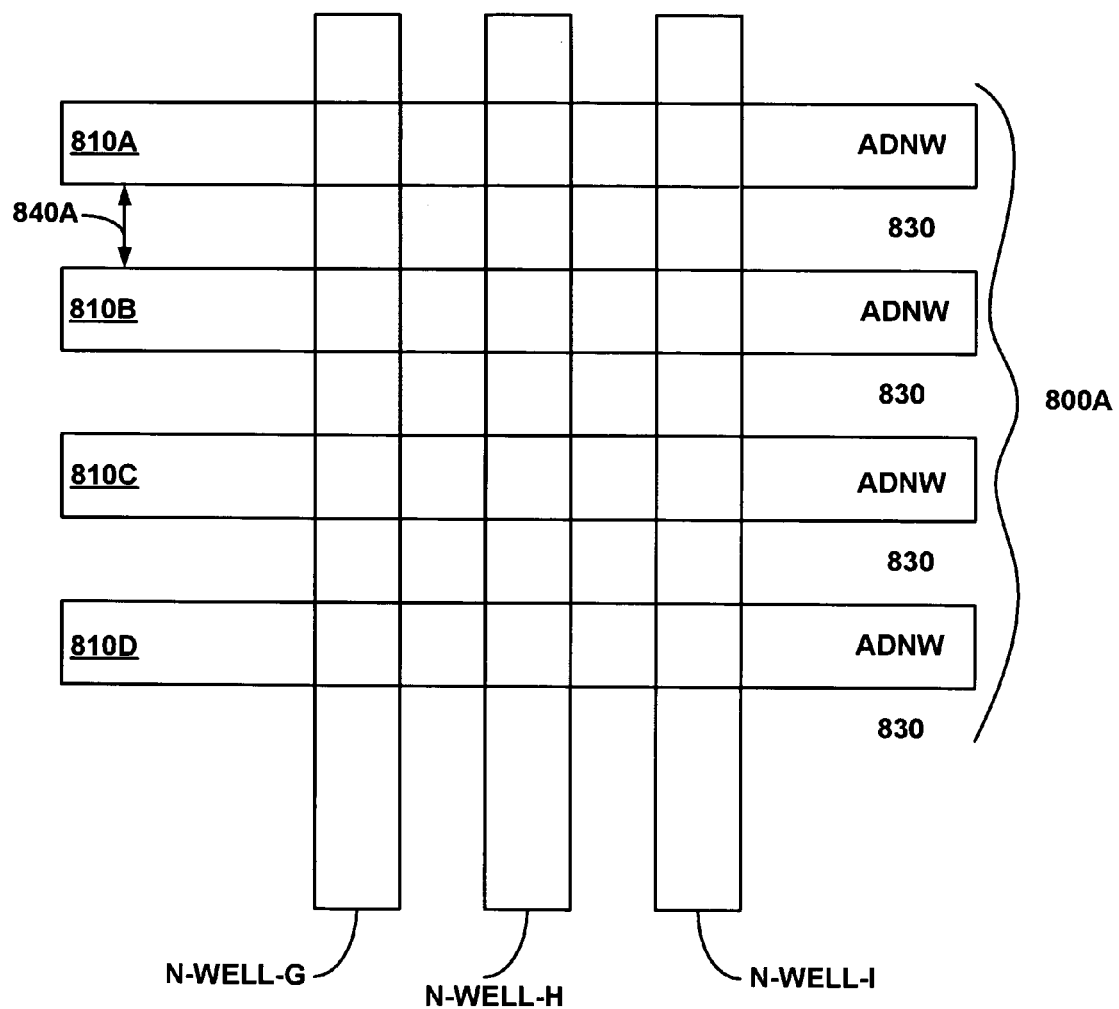
FIG. 8A illustrates a top view of multiple axial deep N-well (ADNW) regions forming a first axial sub-surface strip structure in accordance with an embodiment of the present invention.

FIG. 8A illustrates a top view of multiple axial deep N-well (ADNW) regions forming a first axial sub-surface strip structure 800A in accordance with an embodiment of the present invention. In this layout pattern, each axial deep N-well region 810A–810D has a strip shape, is formed beneath the surface N-well layer of a semiconductor device, and is doped with an N-type material. The axial deep N-well regions 810A–810D are formed in a first parallel orientation. The first parallel orientation is parallel to the surface N-well regions (e.g., N-well_G, N-well_H, and N-well_I). In this case, the combination of the surface N-well regions (e.g., N-well_G, N-well_H, and N-well_I) and the first axial sub-surface strip structure 800A forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the first axial sub-surface strip structure 800A to provide a plurality of sub-surface conductive paths between N-well regions without isolating the P-well region located between the N-wells. That is, the first axial sub-surface strip structure 800A contacts the N-wells along the sub-surface conductive boundaries (e.g., sub-surface conductive boundary 25 (FIG. 2A) and sub-surface conductive boundaries 396 and 397 (FIG. 2B).

As described above, the combination of the surface N-well regions (e.g., N-well_G, N-well_H, and N-well_I), and the axial deep N-well regions 810A–810D, which form the first axial sub-surface strip structure 800A, facilitate routing of the body-bias voltage Vnw to the N-well regions so that the pFETs can be body-biased. The first axial sub-surface strip structure 800A can be utilized in areas of the semiconductor device that have a dense layout and are oriented according to the N-well regions of FIG. 3B. It should be understood that the first axial sub-surface strip structure 800A can have other configurations. The gap 840A between adjacent axial deep N-well regions can vary in size. Moreover, the ratio of axial deep N-well regions to gap area 830 can vary.

Figure 8B:
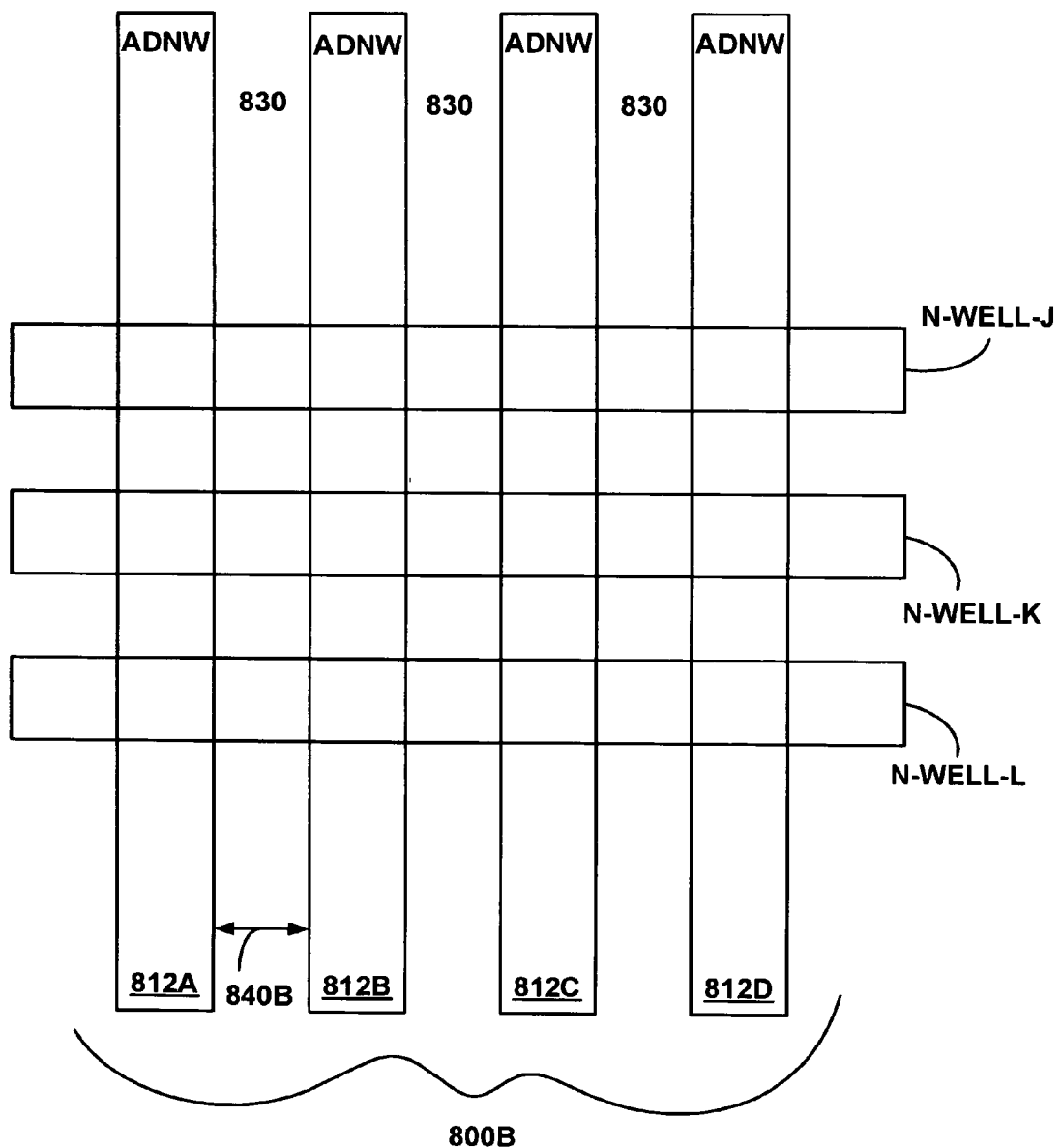
FIG. 8B illustrates a top view of multiple axial deep N-well (ADNW) regions forming a second axial sub-surface strip structure in accordance with an embodiment of the present invention.

FIG. 8B illustrates a top view of multiple axial deep N-well (ADNW) regions forming a second axial sub-surface strip structure 800B in accordance with an embodiment of the present invention. In this layout pattern, each axial deep N-well region 812A–812D has a strip shape, is formed beneath the surface N-well layer of a semiconductor device, and is doped with an N-type material. The axial deep N-well regions 812A–812D are formed in a second parallel orientation. The second parallel orientation is parallel to the surface N-well regions (e.g., N-well_J, N-well_K, and N-well_L). In this case, the combination of the surface N-well regions (e.g., N-well_J, N-well_K, and N-well_L) and the second axial sub-surface strip structure 800B forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the second axial sub-surface strip structure 800B to provide a plurality of sub-surface conductive paths between N-well regions without isolating the P-well region located between the N-wells. That is, the second axial sub-surface strip structure 800B contacts the N-wells along the sub-surface conductive boundaries (e.g., sub-surface conductive boundary 25 (FIG. 2A) and sub-surface conductive boundaries 396 and 397 (FIG. 2B).

As described above, the combination of the surface N-well regions (e.g., N-well_J, N-well_K, and N-well_L), and the axial deep N-well regions 812A–812D, which form the second axial sub-surface strip structure 800A, facilitate routing of the body-bias voltage Vnw to the N-well regions so that the pFETs can be body-biased. The second axial sub-surface strip structure 800B can be utilized in areas of the semiconductor device that have a dense layout and are oriented according to the N-well regions of FIG. 3A. It should be understood that the second axial sub-surface strip structure 800B can have other configurations. The gap 840B between adjacent axial deep N-well regions can vary in size. Moreover, the ratio of axial deep N-well regions to gap area 830 can vary.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device having a surface, comprising:
   a first well region of a first conductivity formed beneath said surface;
   a second well region of said first conductivity formed beneath said surface;
   a region of a second conductivity formed beneath said surface, wherein said region of said second conductivity is located between said first well region and said second well region; and
   a plurality of conductive sub-surface regions of said first conductivity each formed beneath said first and second well regions in one of a first parallel orientation and a second parallel orientation to form a sub-surface mesh structure, and wherein said sub-surface mesh structure is diagonally positioned relative to said first and second well regions such that a first plurality of conductive boundaries are formed between said first well region and said sub-surface mesh structure and a second plurality of conductive boundaries are formed between said second well region and said sub-surface mesh structure to provide a plurality of sub-surface conductive paths between said first and second well regions without isolating said region of said second conductivity.

2. The semiconductor device as recited in claim 1 wherein each conductive sub-surface region has an N-type doping.

3. The semiconductor device as recited in claim 2 wherein said first well region has an N-type doping, and wherein said second well region has an N-type doping.

4. The semiconductor device as recited in claim 3 wherein said first well region includes a p-type MOSFET (metal oxide semiconductor field effect transistor), and wherein said second well region includes a p-type MOSFET.

5. The semiconductor device as recited in claim 4 wherein said region of said second conductivity has a P-type doping, and wherein said region of said second conductivity includes an N-type MOSFET (metal oxide semiconductor field effect transistor).

6. The semiconductor device as recited in claim 1 wherein each conductive sub-surface region has a P-type doping.

7. The semiconductor device as recited in claim 6 wherein said first well region has a P-type doping, and wherein said second well region has a P-type doping.

8. The semiconductor device as recited in claim 7 wherein said first well region includes an N-type MOSFET (metal oxide semiconductor field effect transistor), and wherein said second well region includes an N-type MOSFET.

9. The semiconductor device as recited in claim 8 wherein said region of said second conductivity has an N-type doping, and wherein said region of said second conductivity includes a P-type MOSFET (metal oxide semiconductor field effect transistor).

10. The semiconductor device as recited in claim 1 wherein each conductive sub-surface region has a strip shape.

11. The semiconductor device as recited in claim 1 wherein said sub-surface mesh structure routes a body-bias voltage to said first and second well regions.

12. The semiconductor device as recited in claim 1 wherein said sub-surface mesh structure is rotated approximately 45 degrees relative to said first well region.

13. The semiconductor device as recited in claim 1 wherein said sub-surface mesh structure is rotated approximately 45 degrees relative to said second well region.

14. The semiconductor device as recited in claim 1 wherein an area of said sub-surface mesh structure is equally divided between said conductive sub-surface regions of said first conductivity and a gap area.

15. The semiconductor device as recited in claim 1 further comprising a sub-surface layer of said second conductivity formed beneath said sub-surface mesh structure, wherein a gap between adjacent parallel conductive sub-surface regions is sufficiently wide to avoid pinching-off a conductive path between said region of said second conductivity and said second sub-surface layer of said second conductivity.

16. A semiconductor device having a surface, comprising:
a first well region of a first conductivity formed beneath said surface;
a second well region of said first conductivity formed beneath said surface;
a region of a second conductivity formed beneath said surface, wherein said region of said second conductivity is located between said first well region and said second well region; and
a plurality of conductive sub-surface regions of said first conductivity each formed beneath said first and second well regions in a first parallel orientation, wherein said first parallel orientation is diagonal relative to said first and second well regions such that a first plurality of conductive boundaries are formed between said first well region and said conductive sub-surface regions and a second plurality of conductive boundaries are formed between said second well region and said conductive sub-surface regions to provide a plurality of sub-surface conductive paths between said first and second well regions without isolating said region of said second conductivity.

17. The semiconductor device as recited in claim 16 wherein each conductive sub-surface region has an N-type doping.

18. The semiconductor device as recited in claim 17 wherein said first well region has an N-type doping, and wherein said second well region has an N-type doping.

19. The semiconductor device as recited in claim 18 wherein said first well region includes a p-type MOSFET (metal oxide semiconductor field effect transistor), and wherein said second well region includes a p-type MOSFET.

20. The semiconductor device as recited in claim 19 wherein said region of said second conductivity has a P-type doping, and wherein said region of said second conductivity includes an N-type MOSFET (metal oxide semiconductor field effect transistor).

21. The semiconductor device as recited in claim 16 wherein each conductive sub-surface region has a P-type doping.

22. The semiconductor device as recited in claim 21 wherein said first well region has a P-type doping, and wherein said second well region has a P-type doping.

23. The semiconductor device as recited in claim 22 wherein said first well region includes an N-type MOSFET (metal oxide semiconductor field effect transistor), and wherein said second well region includes an N-type MOSFET.

24. The semiconductor device as recited in claim 23 wherein said region of said second conductivity has an N-type doping, and wherein said region of said second conductivity includes a P-type MOSFET (metal oxide semiconductor field effect transistor).

25. The semiconductor device as recited in claim 16 wherein each conductive sub-surface region has a strip shape.

26. The semiconductor device as recited in claim 16 wherein said conductive sub-surface regions route a body-bias voltage to said first and second well regions.

27. The semiconductor device as recited in claim 16 wherein said first parallel orientation and said first well region form an angle that is approximately 45 degrees.

28. The semiconductor device as recited in claim 16 wherein said first parallel orientation and said second well region form an angle that is approximately 45 degrees.

29. The semiconductor device as recited in claim 16 further comprising a sub-surface layer of said second conductivity formed beneath said conductive sub-surface regions, wherein a gap between adjacent parallel conductive sub-surface regions is sufficiently wide to avoid pinching-off a conductive path between said region of said second conductivity and said sub-surface layer of said second conductivity.

30. A semiconductor device having a surface, comprising:
a first well region of a first conductivity formed beneath said surface;
a second well region of said first conductivity formed beneath said surface;
a region of a second conductivity formed beneath said surface, wherein said region of said second conductivity is located between said first well region and said second well region; and
a plurality of conductive sub-surface regions of said first conductivity each formed beneath said first and second well regions in one of a first parallel orientation and a second parallel orientation to form a sub-surface mesh structure, and wherein said sub-surface mesh structure is axially positioned relative to said first and second well regions such that a first plurality of conductive boundaries are formed between said first well region and said sub-surface mesh structure and a second plurality of conductive boundaries are formed between said second well region and said sub-surface mesh structure to provide a plurality of sub-surface conductive paths between said first and second well regions without isolating said region of said second conductivity.

31. The semiconductor device as recited in claim 30 wherein each conductive sub-surface region has an N-type doping.

32. The semiconductor device as recited in claim 31 wherein said first well region has an N-type doping, and wherein said second well region has an N-type doping.

33. The semiconductor device as recited in claim 32 wherein said first well region includes a p-type MOSFET (metal oxide semiconductor field effect transistor), and wherein said second well region includes a p-type MOSFET.

34. The semiconductor device as recited in claim 33 wherein said region of said second conductivity has a P-type doping, and wherein said region of said second conductivity includes an N-type MOSFET (metal oxide semiconductor field effect transistor).

35. The semiconductor device as recited in claim 30 wherein each conductive sub-surface region has a P-type doping.

36. The semiconductor device as recited in claim 35 wherein said first well region has a P-type doping, and wherein said second well region has a P-type doping.

37. The semiconductor device as recited in claim 36 wherein said first well region includes an N-type MOSFET (metal oxide semiconductor field effect transistor), and wherein said second well region includes an N-type MOSFET.

38. The semiconductor device as recited in claim 37 wherein said region of said second conductivity has an N-type doping, and wherein said region of said second conductivity includes a P-type MOSFET (metal oxide semiconductor field effect transistor).

39. The semiconductor device as recited in claim 30 wherein each conductive sub-surface region has a strip shape.

40. The semiconductor device as recited in claim 30 wherein said sub-surface mesh structure routes a body-bias voltage to said first and second well regions.

41. The semiconductor device as recited in claim 30 wherein said first parallel orientation is parallel to said first well region, and wherein said second parallel orientation is perpendicular to said first well region.

42. The semiconductor device as recited in claim 30 wherein said first parallel orientation is parallel to said second well region, and wherein said second parallel orientation is perpendicular to said second well region.

43. The semiconductor device as recited in claim 30 wherein an area of said sub-surface mesh structure is equally divided between said conductive sub-surface regions of said first conductivity and a gap area.

44. The semiconductor device as recited in claim 30 further comprising a sub-surface layer of said second conductivity formed beneath said sub-surface mesh structure, wherein a gap between adjacent parallel conductive sub-surface regions is sufficiently wide to avoid pinching-off a conductive path between said region of said second conductivity and said sub-surface layer of said second conductivity.

45. A semiconductor device having a surface, comprising:
    a first well region of a first conductivity formed beneath said surface;
    a second well region of said first conductivity formed beneath said surface;
    a region of a second conductivity formed beneath said surface, wherein said region of said second conductivity is located between said first well region and said second well region; and
    a plurality of conductive sub-surface regions of said first conductivity each formed beneath said first and second well regions in a first parallel orientation, wherein said first parallel orientation is perpendicular relative to said first and second well regions such that a first plurality of conductive boundaries are formed between said first well region and said conductive sub-surface regions and a second plurality of conductive boundaries are formed between said second well region and said conductive sub-surface regions to provide a plurality of sub-surface conductive paths between said first and second well regions without isolating said region of said second conductivity.

46. The semiconductor device as recited in claim 45 wherein each conductive sub-surface region has an N-type doping.

47. The semiconductor device as recited in claim 46 wherein said first well region has an N-type doping, and wherein said second well region has an N-type doping.

48. The semiconductor device as recited in claim 47 wherein said first well region includes a p-type MOSFET (metal oxide semiconductor field effect transistor), and wherein said second well region includes a p-type MOSFET.

49. The semiconductor device as recited in claim 48 wherein said region of said second conductivity has a P-type doping, and wherein said region of said second conductivity includes an N-type MOSFET (metal oxide semiconductor field effect transistor).

50. The semiconductor device as recited in claim 45 wherein each conductive sub-surface region has a P-type doping.

51. The semiconductor device as recited in claim 50 wherein said first well region has a P-type doping, and wherein said second well region has a P-type doping.

52. The semiconductor device as recited in claim 51 wherein said first well region includes an N-type MOSFET (metal oxide semiconductor field effect transistor), and wherein said second well region includes an N-type MOSFET.

53. The semiconductor device as recited in claim 52 wherein said region of said second conductivity has an N-type doping, and wherein said region of said second conductivity includes a P-type MOSFET (metal oxide semiconductor field effect transistor).

54. The semiconductor device as recited in claim 45 wherein each conductive sub-surface region has a strip shape.

55. The semiconductor device as recited in claim 45 wherein said conductive sub-surface regions route a body-bias voltage to said first and second well regions.

56. The semiconductor device as recited in claim 45 further comprising a sub-surface layer of said second conductivity formed beneath said conductive sub-surface regions, wherein a gap between adjacent parallel conductive sub-surface regions is sufficiently wide to avoid pinching-off a conductive path between said region of said second conductivity and said sub-surface layer of said second conductivity.

* * * * *